(12) United States Patent
Kim et al.

(10) Patent No.: US 7,341,889 B2
(45) Date of Patent: Mar. 11, 2008

(54) LEAD FRAME FOR SEMICONDUCTOR PACKAGE AND METHOD OF FABRICATING SEMICONDUCTOR PACKAGE

(75) Inventors: Jeung-Il Kim, Changwon-si (KR); Se-hoon Cho, Changwon-si (KR)

(73) Assignee: Samsung Techwin Co., Ltd. (KR)

( * ) Notice: Subject to any disclaimer, the term of this patent is extended or adjusted under 35 U.S.C. 154(b) by 157 days.

(21) Appl. No.: 10/923,454

(22) Filed: Aug. 20, 2004

(65) Prior Publication Data

US 2005/0184364 A1 Aug. 25, 2005

(30) Foreign Application Priority Data

Feb. 23, 2004 (KR) .................. 10-2004-0011816

(51) Int. Cl.
*H01L 21/00* (2006.01)

(52) U.S. Cl. ............... 438/111; 438/123; 257/666; 257/E23.034

(58) Field of Classification Search .......... 438/107, 438/110, 111, 114, 118, 123, 124; 257/666, 257/676, E23.034, E33.066, E23.031, E23.042, 257/E23.043, E23.049, E23.05
See application file for complete search history.

(56) References Cited

U.S. PATENT DOCUMENTS

| | | | |
|---|---|---|---|
| 6,700,192 B2 * | 3/2004 | Matsuzawa et al. | 257/692 |
| 6,875,630 B2 * | 4/2005 | Kasahara et al. | 438/106 |
| 2002/0153596 A1 * | 10/2002 | Tsubosaki et al. | 257/666 |
| 2004/0140039 A1 * | 7/2004 | Yamamoto | 156/73.6 |

\* cited by examiner

*Primary Examiner*—Lex Malsawma
*Assistant Examiner*—Khiem D Nguyen
(74) *Attorney, Agent, or Firm*—Tuchman & Park LLC

(57) ABSTRACT

Provided is a method for fabricating a semiconductor package with a lead frame and the semiconductor package provided thereof. The method includes supplying a lead frame with a plurality of molding regions for molding a plurality of semiconductor packages, and attaching tape to at least one surface of the lead frame to prevent a molten molding material from contacting the lead frame on that surface. The tape comprises a plurality of vacant regions corresponding to the boundary of each molding region. This method distributes the tension and expansion stress of the tape caused by a heating roller when laminating the tape on the lead frame, thereby preventing bending of the strip.

9 Claims, 8 Drawing Sheets

LEAD FRAME FOR SEMICONDUCTOR PACKAGE AND METHOD OF FABRICATING SEMICONDUCTOR PACKAGE

BACKGROUND OF THE INVENTION

This application claims the priority of Korean Patent Application No. 2004-11816, filed on Feb. 23, 2004, in the Korean Intellectual Property Office, the disclosure of which is incorporated by reference.

FIELD OF THE INVENTION

The present invention relates to a method of fabricating a semiconductor package with a lead frame, and more particularly, a lead frame with perforated or segregated pieces of tape attached thereto to prevent a molding material from adhering at least one face of the lead frame when fabricating a semiconductor package such as a chip scale package, and a semiconductor package fabricated with a lead frame and a tape.

DESCRIPTION OF THE RELATED ART

Conventional chip scale packages (CSP) that use a lead frame include micro lead frames (MLF), bottom leaded plastic packages (BLP), and bumped chip carriers (BCC). These products transmit electrical signals to an external circuit substrate through a terminal.

Figure 1:
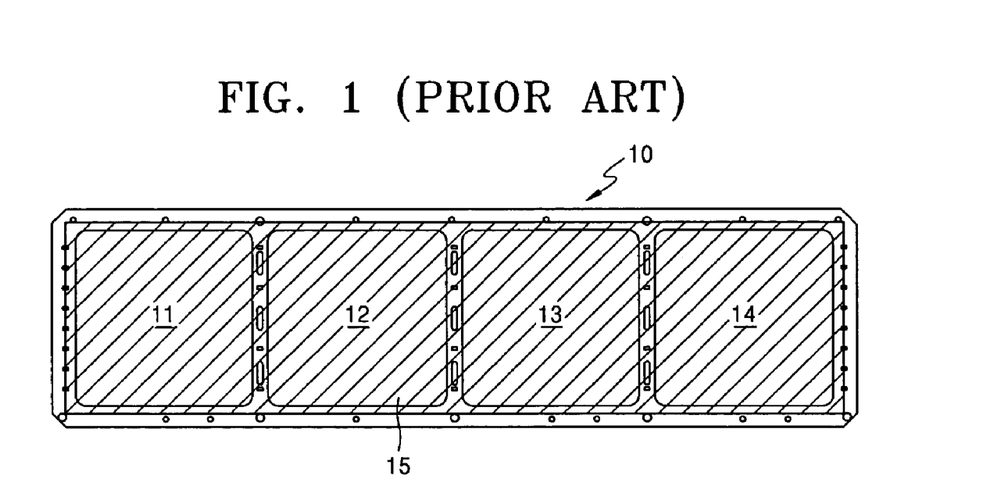
FIG. 1 is a schematic plan view of a conventional lead frame with a tape attached thereon.

As depicted in FIG. 1, in a conventional lead frame, a plurality of regions 11-14 each correspond to a respective one of a plurality of chip scale packages on a strip 10. A semiconductor chip is placed on each region and each semiconductor chip is wire-bonded to a lead part.

Back side tape 15 is attached to a surface of the strip 10, before a protective molding is placed over the semiconductor chip, in order to prevent the molding material from contacting and adhering to the bottom surface of the lead frame. As shown, the back side tape 15 is attached to the entire surface of the strip 10 using a thermal compression means such as a heating roller.

After attaching the back side tape 15 to the surface of the strip 10, a molding material is deposited on the semiconductor chips. The packaging process is completed by singulating the individual chip scale packages with a cutting device such as a saw.

However, the conventional method of fabricating the chip scale package has the following problems.

Figure 2:
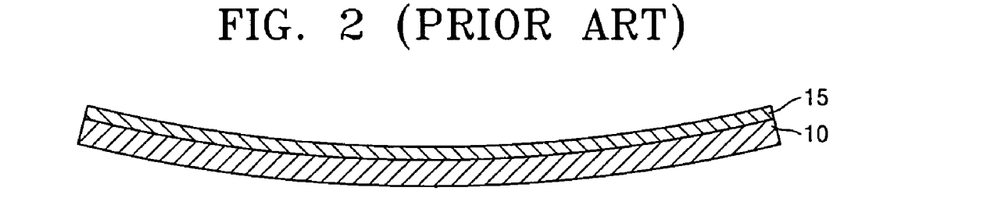
FIG. 2 is a cross-sectional view illustrating the conventional lead frame of FIG. 1 that is bent.

First, as depicted in FIG. 2, during the fabrication of the chip scale packages, the strip can be bent or twisted due to a difference in material characteristics, such as different coefficients of thermal expansion (CTE) between the strip 10 and the tape 15. Therefore, the strip 10 may be damaged by the bending during handling of the strip 10 between processes, during the process of attaching a chip to the lead frame, or during the process of wire bonding. This phenomenon is caused during laminating by a tensile force acting in a length direction of the strip 10 and the expansion stress of the tape 15.

Second, the strip 10 may be bent as tape 15 contracts over time.

Figure 3:
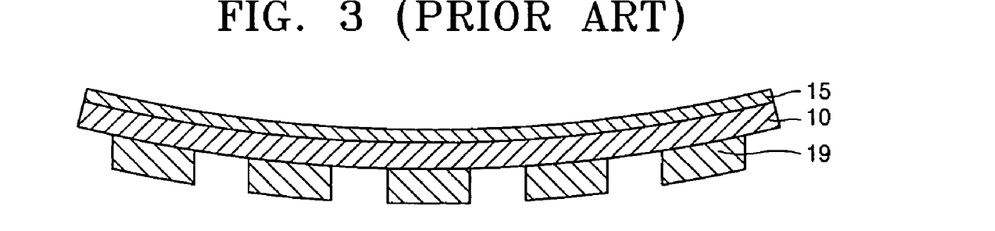
FIG. 3 is a cross-sectional view illustrating the conventional lead frame of FIG. 1 that is bent.

Third, as depicted in FIG. 3, the strip 10 can further be bent or warped during the packaging process of the semiconductors due to differences in the contraction and expansion rate between a molding material 19, the strip 10, and the tape 15.

SUMMARY OF THE INVENTION

The present invention provides a method for fabricating a semiconductor package with a lead frame and a tape attached thereto to prevent a molten molding material from contacting one face of the lead frame, and a semiconductor package fabricated with the lead frame and tape.

According to one aspect of the present invention, there is provided a method of fabricating a semiconductor package with a lead frame comprising: supplying a lead frame with a plurality of regions for incorporating a plurality of semiconductor packages thereon; and attaching a tape to a surface of the lead frame in a manner to cover substantially the entire surface of the lead frame except boundary areas of the semiconductor package incorporating regions such that a molding material can be prevented from adhering to covered surfaces of the lead frame during a subsequent molding process of the semiconductor packages.

According to one preferred embodiment, a plurality of separate tapes can be attached to the plurality of semiconductor incorporating regions of the lead frame by thermal compression with a heating roller.

According to another preferred embodiment, a unitary tape can be attached to the surface of the lead frame, wherein the unitary tape comprising a plurality of main regions for covering the semiconductor package incorporating regions of the lead frame and at least one bridge region connecting adjacent main regions of the tape. In forming the unitary tape, pieces of tape for covering the semiconductor incorporating regions may be connected by bridge tape portions at the boundary between the adjacent semiconductor incorporating regions. Vacant regions of the tape may be created by punching holes or slots through the tape along the boundary between the semiconductor incorporating regions.

According to another aspect of the present invention, there is provided a lead frame with a tape attached thereto, comprising a semiconductor lead frame including a plurality of regions for incorporating a plurality of semiconductor packages thereto; and a tape attached to a surface of the lead frame, the tape covering substantially the entire surface of the lead frame except boundary areas of the semiconductor package incorporating regions of the lead frame.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will now be described more fully with reference to the accompanying drawings in which embodiments of the present invention are shown.

Figure 4:
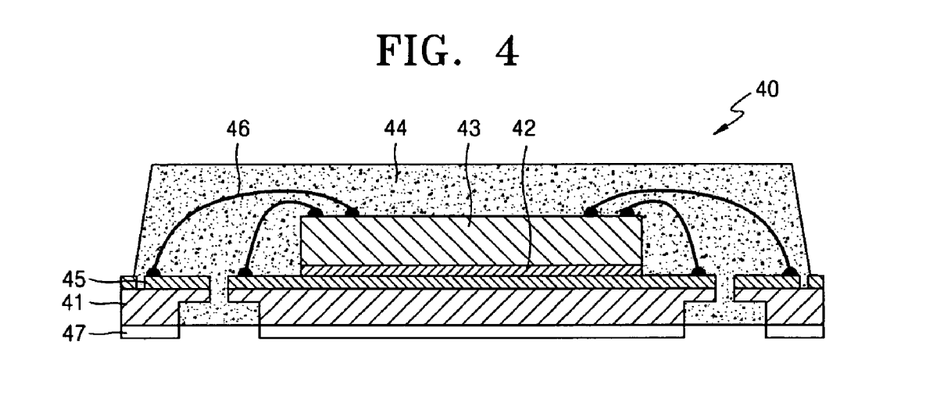
FIG. 4 is a cross-sectional view of a chip scale package according to one embodiment of the present invention.

FIG. 4 is a cross-sectional view of a chip scale package 40 according to an embodiment of the present invention.

Referring to FIG. 4, the chip scale package 40 includes a lead frame 41, a semiconductor chip 43 attached to the lead frame 41 by an adhesive 42, and a molding material 44 that molds the lead frame 41 and the semiconductor chip 43.

A plating layer 45, composed of gold or silver, is formed on an upper surface of the patterned semiconductor lead frame 41, and each of the lead parts of the semiconductor lead frame 41 is wire-bonded to the semiconductor chip 43 by a wire 46. Also, a solder plating layer 47 is formed on a lower surface of the semiconductor lead frame 41.

The lower surface of the lead frame 41 forms an electrical connection with a terminal of an external circuit substrate.

The portion of the semiconductor chip 43 wire-bonded to the lead frame 41 with a wire 46 is protected by a molding material 44.

The chip scale package according to an embodiment of the present invention has a structure that protects against deformation due to the difference in contraction rate and expansion rate between the semiconductor lead frame 41 and the back side tape. The backside tape prevents the molten molding material 44 from contacting the exposed lower surface of the lead frame 41 during a process of fabricating a semiconductor package.

Figure 5:
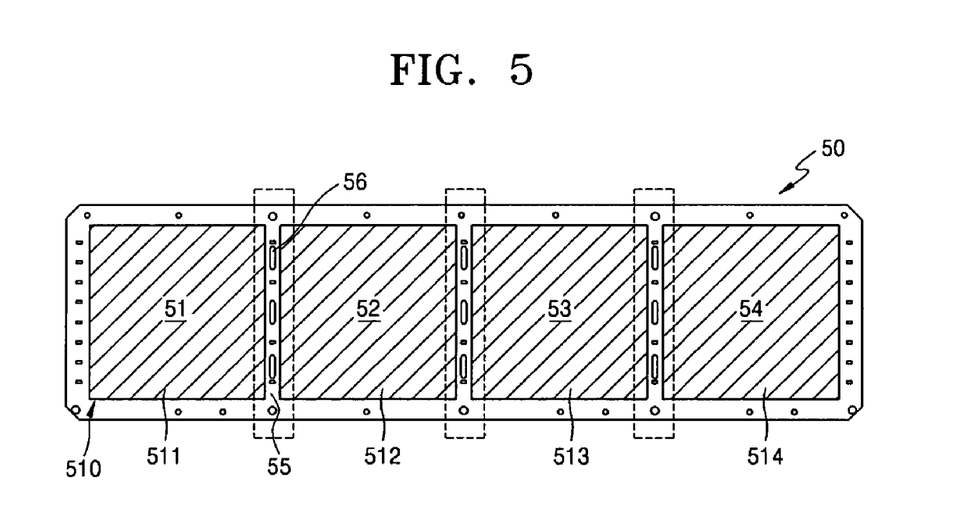
FIG. 5 is a schematic plan view of a lead frame according to one embodiment of the present invention.

FIG. 5 is a plan view of a strip 50 for a lead frame according to a first embodiment of the present invention.

Referring to FIG. 5, the strip 50 includes a plurality of regions 51-54 corresponding to an individual chip scale package. In each of the regions a semiconductor chip is mounted, a patterned lead part of the lead frame is wire-bonded to the semiconductor chip, and a plurality of chip scale packages are fabricated by molding the wire-bonded portion. The fabricated chip scale package is singulated into a plurality of individual chip scale packages by cutting with a cutting means such as a saw.

The strip 50 is interconnected by bridges 55 formed between the regions 51-54, and in each of the bridges 55, a plurality of through holes 56 are formed to simplify cutting. In the strip 50, the regions 51-54 are formed in one row, however, a plurality of chip scale packages can be formed in a plurality of rows.

Back side tape 510 is attached to the regions 51-54 of the strip 50, on the surface of the lead frame opposite to a surface which will be molded to prevent contact with the molten molding material.

The tape is supplied in a wound state from a coil, attached to a surface of the strip 50 by thermal compression with a heating roller, and detached after a molding process. The tape 510 is individually attached to each of the regions 51-54 of the strip 50.

That is, a first region 51, a second region 52, a third region 53, and a fourth region 54 of the strip 50 have a first tape 511, second tape 512, third tape 513, and fourth tape 514 attached thereto, respectively.

FIGS. 6A through 6E are plan views illustrating a method of attaching back side tapes 511-514 to the regions 51-54 of the strip 50.

Figure 6A:
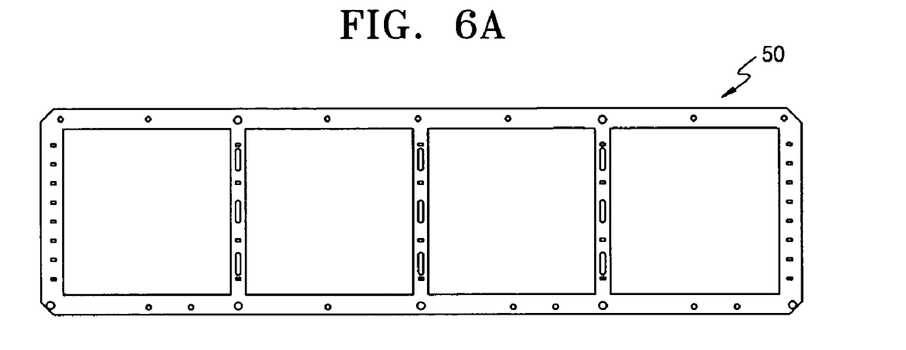
FIGS. 6A through 6E are schematic plan views illustrating a method of attaching tapes to the lead frame of FIG. 5 according to one embodiment of the present invention.
Figure 6B:
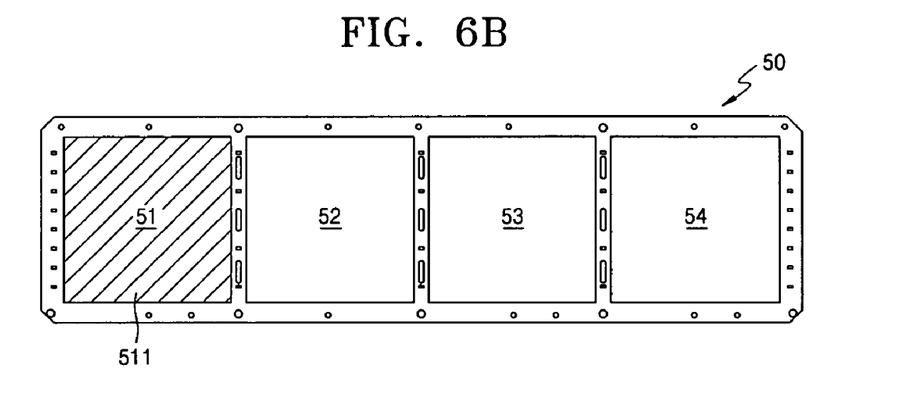
Figure 6C:
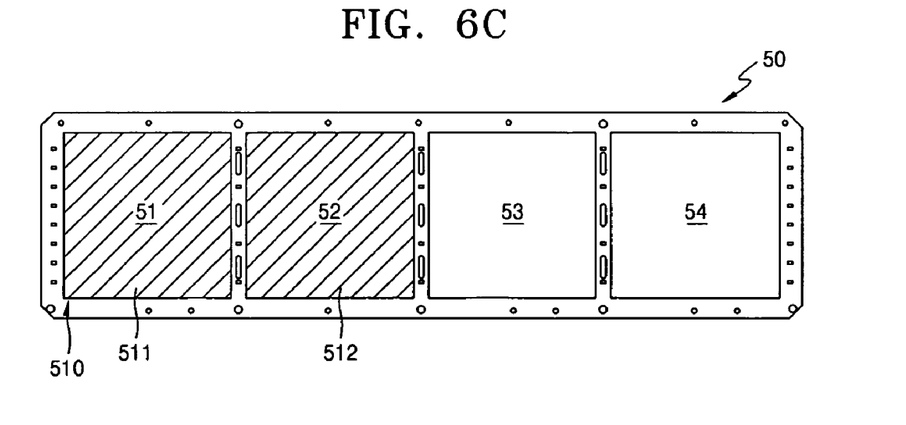
Figure 6D:
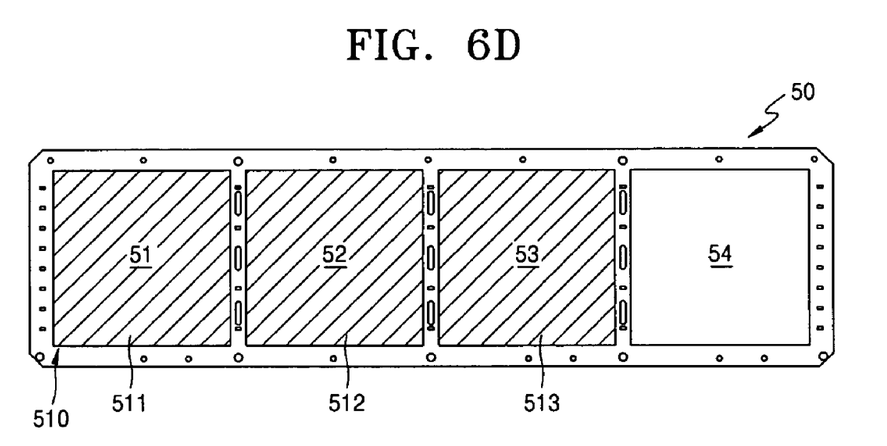
Figure 6E:
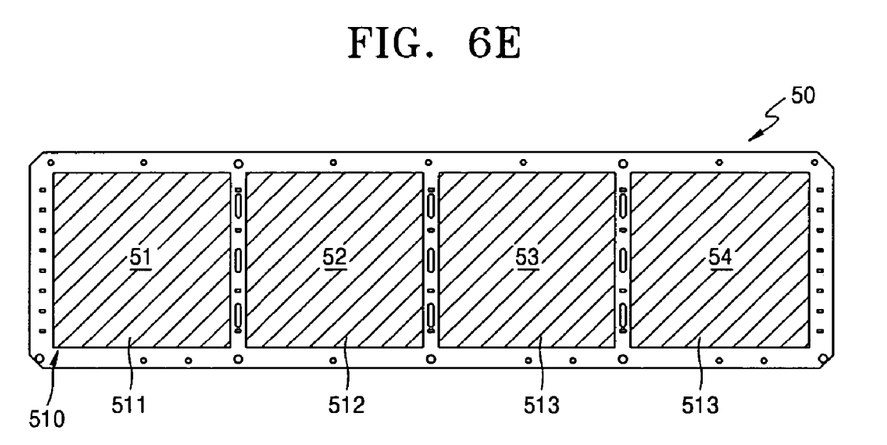

Referring to FIGS. 6A through 6E, the strip 50 is supplied (FIG. 6A), and the first tape 511 is attached to the first region 51 (FIG. 6B). In the same way, the second tape 512 is attached to the second region 52 (FIG. 6C), the third tape 513 is attached to the third region 58 (FIG. 6D), and the fourth tape 514 is attached to the fourth region 54 (FIG. 6E).

FIGS. 7A through 7F are sectional views illustrating a semiconductor packaging process including the taping process.

Figure 7A:
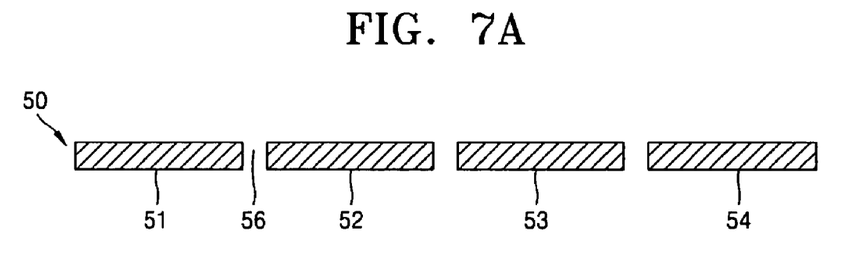
FIGS. 7A through 7F are schematic cross-sectional views illustrating the method of attaching the tape to the lead frame of FIG. 5 according to one embodiment of the present invention.

A strip 50 for a lead frame is composed of a metal having high thermal conductivity such as copper. According to one preferred embodiment of the invention, a plurality of lead frame strips can be supplied in series for applying the taping process onto massive lead frames. Each strip 50 includes a plurality of package regions such as a first region 51, a second region 52, a third region 53, and a fourth region 54 each corresponding to their respective chip scale packages. The first through fourth regions 51-54 are arranged along a length direction of the strip 50. The adjacent regions of the first through fourth regions are connected by bridges 55, and through holes 56 are formed in each of the bridges 55.

The back side tape is attached to the first through fourth regions 51-54 of the stripe 50 to prevent molten molding material from contacting one face of the lead frame in the regions 51-54.

Figure 7B:
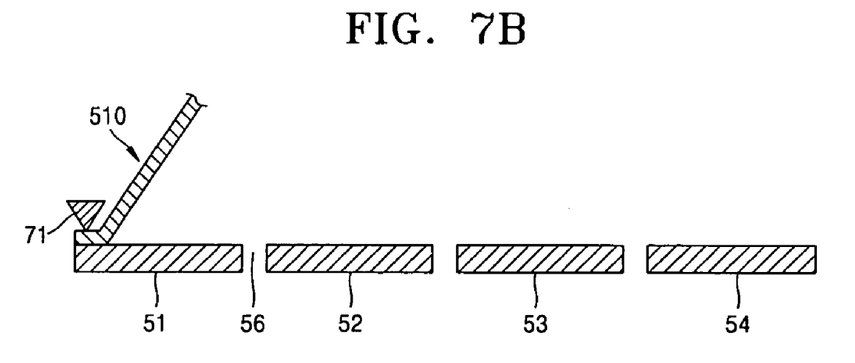

Tape 510 is placed to the left of the first region 51 and cut with a knife 71 (FIG. 7B).

Figure 7C:
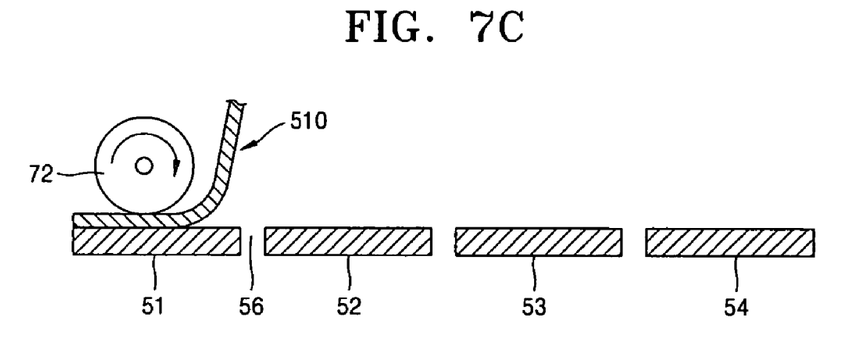

Then, the tape 510 is thermally compressed by a heating roller 72 on the surface of the first region 51. The temperature of the heating roller 72 is approximately 200±10° C. and the compression is maintained for about 10 seconds to 50 minutes. The tape 510 can be attached to the first region 51 by moving the roller 72 in a single direction, or the tape 510 can be attached to the first region 51 by moving the roller 72 in two opposite directions (FIG. 7C).

Figure 7D:
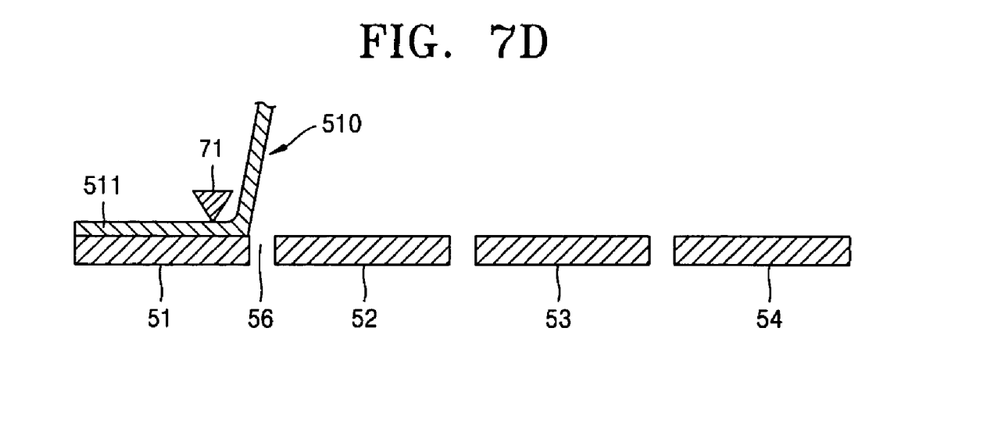

Then, the knife 71 cuts the tape 510 at a distance equal to the pitch of each region (FIG. 7D). This process can be automated by a machine utilizing the pre-determined dimension of the pitch.

Figure 7E:
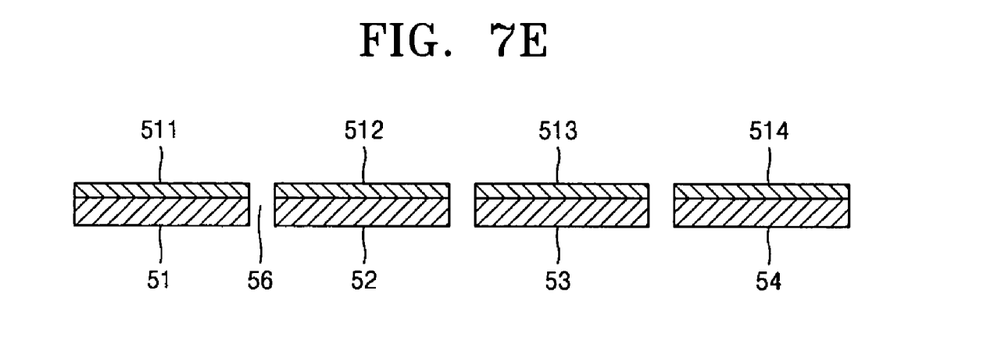

By repeating the above process, the second tape 512, the third tape 513, and the fourth tape 514 are attached to the second region 52, the third region 53, and the fourth region 54, respectively.

Figure 7F:
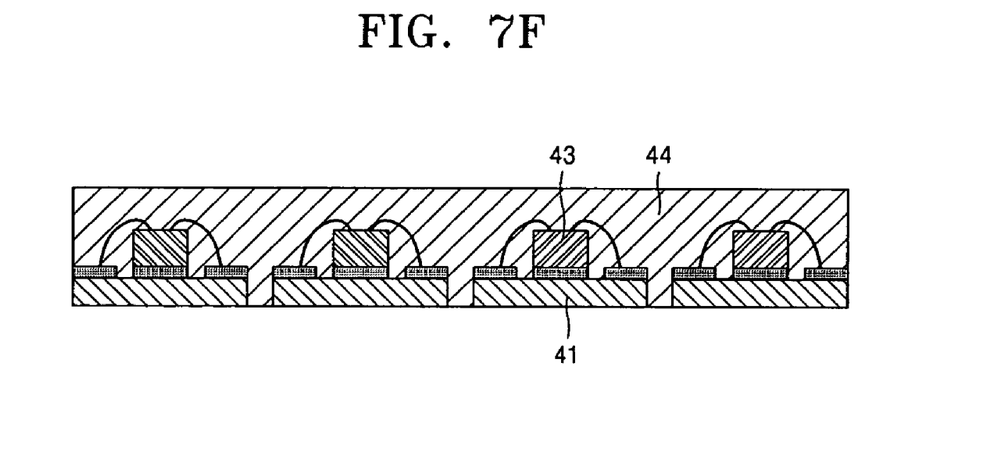

Thereafter, a semiconductor chip is mounted on each of the regions 51-54 of the strip 50 and each of lead frames is wire-bonded to each of the semiconductor chips. As depicted in FIG. 7F, the strip 50 is molded with a molten molding material 44 applied to the semiconductor package except the regions covered by the tapes 511-514.

Since the tapes 511-514 protect the regions 51-54, the molten molding material 44 does not adhere to the bottom of the strip 50 during molding. After the molding, the tape is removed from the surface of the strip 50 using a tape removing means.

Figure 8:
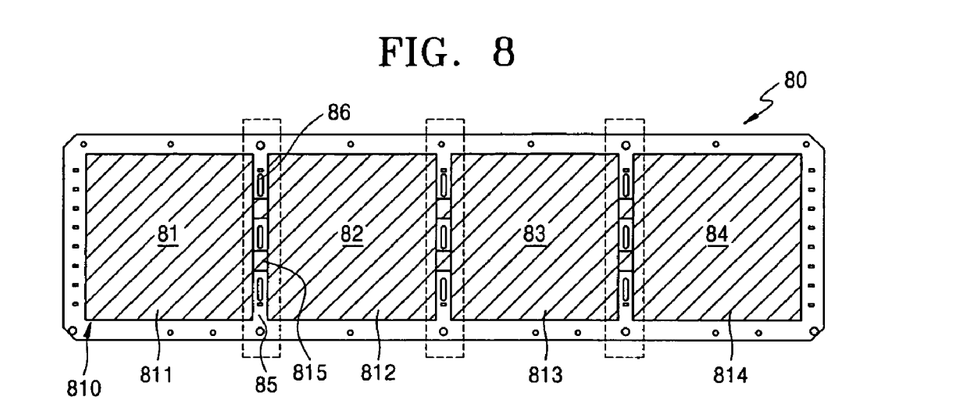
FIG. 8 is a schematic plan view of a lead frame according to another embodiment of the present invention.

FIG. 8 is a plan view of a strip 80 for a lead frame according to a second embodiment of the present invention.

Referring to FIG. 8, first through fourth regions 81-84 are formed on a strip 80. The first through fourth regions 81-84 are connected by bridges 85 in which a plurality of through holes 86 are formed.

Tape 810 is attached to the strip 80 during a taping process such that first through fourth tapes 811-814 are attached to the first through fourth regions 81-84, respectively.

Here, the first through fourth tapes 811-814 are attached individually to the first through fourth regions 81-84, with a bridge tape 815 that connects adjacent pieces of tape 810. The bridge tape 815 enables the individual pieces of tape 810 to be removed at once.

Figure 9A:
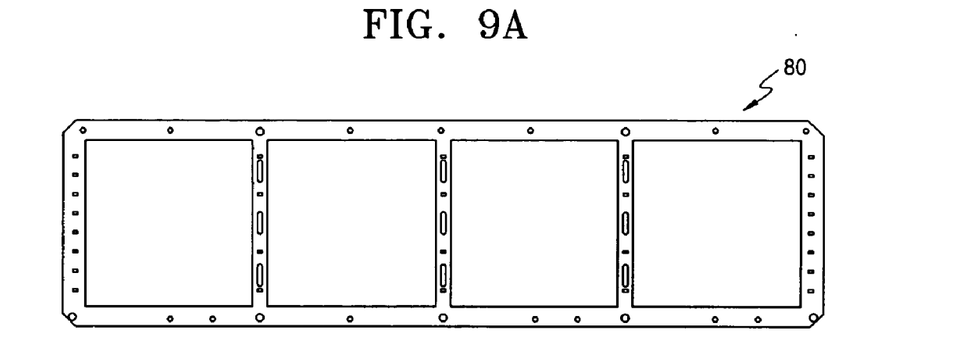
FIGS. 9A through 9C are schematic plan views illustrating a process of attaching a tape to the lead frame of FIG. 8.
Figure 9B:
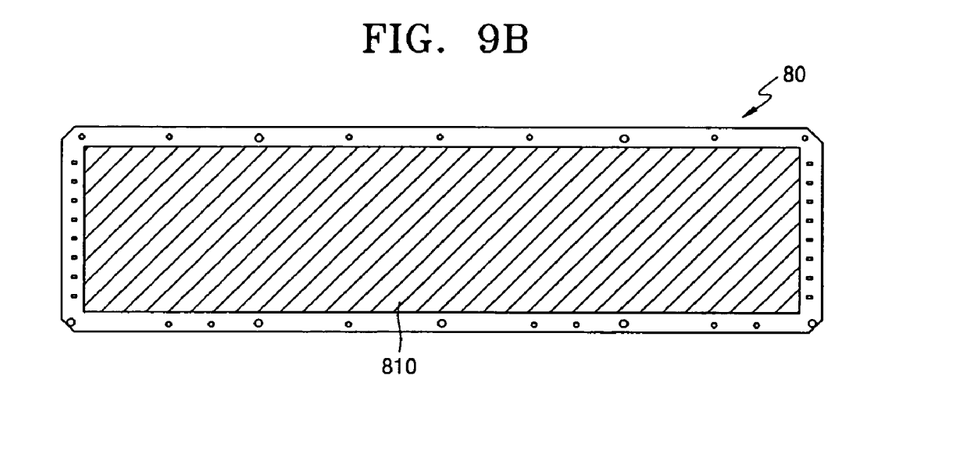
Figure 9C:
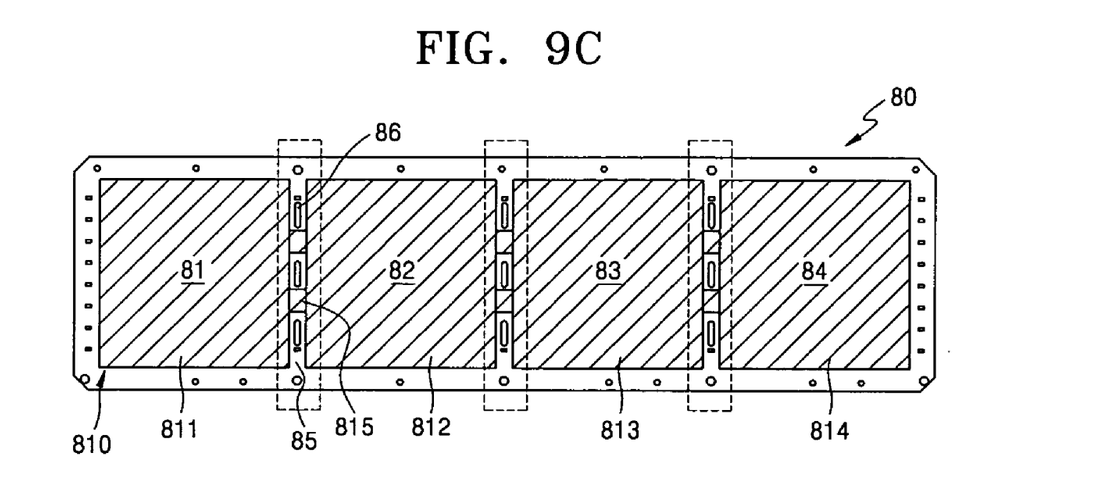

FIGS. 9A through 9C are additional plan views illustrating a taping process according to the second embodiment of the present invention.

A strip 80 for a lead frame is supplied (FIG. 9A). Tape 810, formed in a sheet, is thermally compressed by a heating roller on a surface of the strip 80 (FIG. 9B). Then, bridge tape 815 is formed at boundaries of the first through fourth regions 81-84 by punching holes or slots into tape 810 (FIG. 9C).

Figure 10:
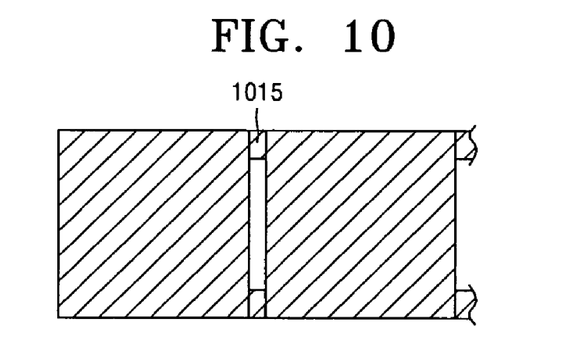
FIG. 10 is a plan view of one example of tape applicable to the lead frame of FIG. 8.
Figure 11:
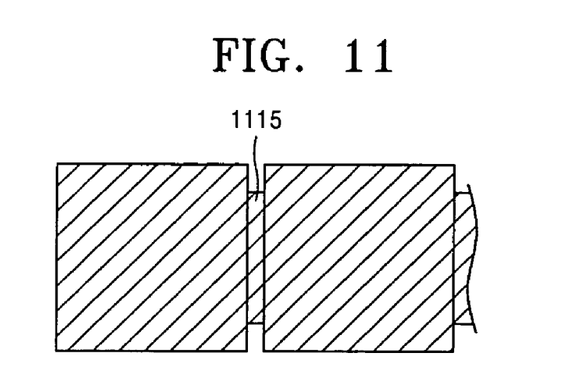
FIG. 11 is a plan view of another example of tape applicable to the lead frame of FIG. 8.

The bridge tape 815 may be spaced a predetermined distance, as illustrated in FIG. 9C. Alternatively, bridge tape 1015 may connect the upper and lower corners of adjacent tape, as illustrated in FIG. 10. Further, bridge tape 1115 may connect middle portions of adjacent sides of tape, as illustrated in FIG. 11. Also, the bridge tape may be formed by punching the tape in regions that correspond to the through holes of the strip 80.

This method of fabricating a semiconductor package with a lead frame provides numerous advantages, because it thermally compresses individual pieces of tape over the regions of the lead frame where the semiconductor package will be formed.

First, tension and expansion stress of the tape caused by a heating roller when laminating the tape onto a strip can be properly distributed in the length direction of the strip. Therefore, bending of the strip can be prevented.

Second, bending of the strip due to a restoration force of the tape, which may expand over time, can be prevented.

Third, bending of the strip due to the differences in the contraction rate and the expansion rate before and after molding due to the differences in physical properties among the molding material, the tape, and the lead frame can be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor package with a lead frame comprising:
   supplying a lead frame with a plurality of regions for incorporating a plurality of semiconductor packages thereon;
   providing a tape in a roll form, the tape having a width smaller than the width of the lead frame;
   cutting the tape into a plurality of separate tapes, a length of each cut tape corresponding to the length of each semiconductor package incorporating region of the lead frame; and
   attaching the cut tapes one after another to a surface of the lead frame in a manner to cover substantially the entire surface of the lead frame except boundary areas lying around and between the semiconductor package incorporating regions such that a molding material can be prevented from adhering to the covered surfaces of the lead frame during a subsequent molding process of the semiconductor packages.

2. The method of claim 1, wherein the tape attaching step is performed by thermal compression with a heating roller.

3. The method of claim 1, wherein a plurality of lead frames are supplied in series for the attachment of the tapes to the lead frames.

4. A method of fabricating a semiconductor package with a lead frame comprising:
   supplying a lead frame with a plurality of regions for incorporating a plurality of semiconductor packages thereon;
   providing a tape in a roll form, the tape having a width smaller than the width of the lead frame;
   cutting the roll tape into a cut tape, the cut tape having a length smaller than the length of the lead frame;
   attaching the cut tape to a surface of the lead frame in a manner to cover substantially the entire surface of the lead frame except outer circumferential areas of the lead frame; and
   removing portions of tape from boundary areas lying between the semiconductor package incorporating regions such that a unitary tape, having a plurality of main regions for covering the semiconductor package incorporating regions of the lead frame and at least one bridge region of predetermined width for connecting adjacent main regions of the tape, is formed on the surface of the lead frame and that a molding material can be prevented from adhering to the tape covered surfaces of the lead frame during a subsequent molding process of the semiconductor packages.

5. The method of claim 4, wherein the tape removing step is performed by punching holes or slots of a predetermined width in the boundary areas after the attachment of the tape to the lead frame.

6. The method of claim 4, wherein portions of tape are removed from areas adjacent to through holes formed in the lead frame.

7. The method of claim 4, wherein portions of tape are removed from central regions of the boundary areas.

8. The method of claim 4, wherein portions of tape are removed from side regions of the boundary areas.

9. A method of fabricating a semiconductor package with a lead frame comprising:
   supplying a lead frame having a width, a length, a first end, and a second end, the lead frame including a plurality of semiconductor package incorporating regions arranged in the lead frame and a plurality of bridge regions each defined between two adjacent ones of the semiconductor package incorporating regions;
   providing a tape in a roll form, the tape having a width corresponding to the width of the lead frame and having a length at least the same with or longer than the length of the lead frame;
   placing a starting end of the tape on the lead frame such that the starting end of the tape corresponds to a starting end of a first one of the semiconductor package incorporating regions;
   placing a heating roller on the placed starting end of the tape;
   rolling the heating roller in a direction to the second end of the lead frame;
   cutting the tape such that the ending end of a resultant first cut tape corresponds to the ending end of the first one of the semiconductor package incorporating regions;
   placing a subsequent starting end of the tape on the lead frame such that the subsequent starting end of the tape corresponds to a starting end of a subsequent one of the semiconductor package incorporating regions, and thereby defining a tape uncovered region corresponding to the width of the bridge region of the lead frame;

placing the heating roller on the placed subsequent starting end of the tape;

rolling the heating roller in a direction to the second end of the lead frame;

cutting the tape such that the ending end of a resultant subsequent cut tape corresponds to the ending end of a subsequent one of the semiconductor package incorporating regions; and repeating the immediately above four steps of placing through cutting to a next one of the semiconductor package incorporating regions until a resultant last cut tape covers a last one of the semiconductor package incorporating regions in the lead frame.

* * * * *